(12) United States Patent
Saxler (10) Patent No.: US 8,153,515 B2
(45) Date of Patent: Apr. 10, 2012

(54) METHODS OF FABRICATING STRAIN BALANCED NITRIDE HETEROJUNCTION TRANSISTORS

(75) Inventor: Adam William Saxler, Durham, NC (US)

(73) Assignee: Cree, Inc., Durham, NC (US)

( * ) Notice: Subject to any disclaimer, the term of this patent is extended or adjusted under 35 U.S.C. 154(b) by 1047 days.

(21) Appl. No.: 11/325,735

(22) Filed: Jan. 5, 2006

(65) Prior Publication Data

US 2006/0121682 A1    Jun. 8, 2006

Related U.S. Application Data

(62) Division of application No. 10/199,786, filed on Jul. 19, 2002, now Pat. No. 7,030,428.

(60) Provisional application No. 60/337,687, filed on Dec. 3, 2001.

(51) Int. Cl.
*H01L 21/28* (2006.01)

(52) U.S. Cl. ........ 438/604; 438/163; 438/335; 257/254; 257/E21.085; 257/E29.089

(58) Field of Classification Search .................. 438/163, 438/164, 165, 166, 167, 168, 170, 189, 191, 438/194, 202, 235, 311, 335, 604, FOR. 264, 438/FOR. 267; 257/E29.246–E29.253, 18, 257/254, 189, 200, 201, E29.089, E21.085, 257/E21.086, E21.108, E21.126, E21.138

See application file for complete search history.

(56) References Cited

U.S. PATENT DOCUMENTS 4,424,525 A    1/1984   Mimura .......................... 357/23

(Continued)

FOREIGN PATENT DOCUMENTS

EP    0 334 006 A1    9/1989

(Continued)

OTHER PUBLICATIONS

Linear Regression: http://science.widener.edu/svb/stats/regress.html.*

(Continued)

*Primary Examiner* — Olik Chaudhuri
*Assistant Examiner* — Su Kim
(74) *Attorney, Agent, or Firm* — Myers Bigel Sibley & Sajovec (57) ABSTRACT

A nitride based heterojunction transistor includes a substrate and a first Group III nitride layer, such as an AlGaN based layer, on the substrate. The first Group III-nitride based layer has an associated first strain. A second Group III-nitride based layer, such as a GaN based layer, is on the first Group III-nitride based layer. The second Group III-nitride based layer has a bandgap that is less than a bandgap of the first Group III-nitride based layer and has an associated second strain. The second strain has a magnitude that is greater than a magnitude of the first strain. A third Group III-nitride based layer, such as an AlGaN or AlN layer, is on the GaN layer. The third Group III-nitride based layer has a bandgap that is greater than the bandgap of the second Group III-nitride based layer and has an associated third strain. The third strain is of opposite strain type to the second strain. A source contact, a drain contact and a gate contact may be provided on the third Group III-nitride based layer. Nitride based heterojunction transistors having an AlGaN based bottom confinement layer, a GaN based channel layer on the bottom confinement layer and an AlGaN based barrier layer on the channel layer, the barrier layer having a higher concentration of aluminum than the bottom confinement layer, are also provided. Methods of fabricating such transistor are also provided.

32 Claims, 3 Drawing Sheets

U.S. PATENT DOCUMENTS

| | | | | |
|---|---|---|---|---|
| 4,471,366 | A | 9/1984 | Delagebeaudeuf et al. | 357/16 |
| 4,727,403 | A | 2/1988 | Hilda et al. | 357/22 |
| 4,755,867 | A | 7/1988 | Cheng | |
| 4,788,156 | A | 11/1988 | Stoneham et al. | 437/22 |
| 4,946,547 | A | 8/1990 | Palmour et al. | |
| 5,053,348 | A | 10/1991 | Mishra et al. | |
| 5,172,197 | A | 12/1992 | Nguyen et al. | |
| 5,192,987 | A | 3/1993 | Khan et al. | 257/183.1 |
| 5,200,022 | A | 4/1993 | Kong et al. | |
| 5,210,051 | A | 5/1993 | Carter, Jr. | |
| 5,292,501 | A | 3/1994 | Degenhardt et al. | |
| 5,296,395 | A | 3/1994 | Khan et al. | 437/40 |
| 5,298,445 | A | 3/1994 | Asano | |
| RE34,861 | E | 2/1995 | Davis et al. | |
| 5,389,571 | A | 2/1995 | Takeuchi et al. | |
| 5,393,993 | A | 2/1995 | Edmond et al. | 257/77 |
| 5,523,589 | A | 6/1996 | Edmond et al. | |
| 5,534,462 | A | 7/1996 | Fiordalice et al. | |
| 5,592,501 | A | 1/1997 | Edmond et al. | 372/45 |
| 5,670,798 | A * | 9/1997 | Schetzina | 257/96 |
| 5,686,737 | A | 11/1997 | Allen | |
| 5,700,714 | A | 12/1997 | Ogihara et al. | |
| 5,701,019 | A | 12/1997 | Matsumoto et al. | 257/192 |
| 5,705,827 | A | 1/1998 | Baba et al. | 257/46 |
| 5,804,482 | A | 9/1998 | Konstantinov et al. | |
| 5,838,706 | A | 11/1998 | Edmond et al. | 372/45 |
| 5,874,747 | A | 2/1999 | Redwing et al. | 257/77 |
| 5,877,519 | A | 3/1999 | Jewell | 257/190 |
| 5,885,860 | A | 3/1999 | Weitzel | 438/178 |
| 5,946,547 | A | 8/1999 | Kim et al. | |
| 5,990,531 | A | 11/1999 | Taskar et al. | |
| 6,028,328 | A | 2/2000 | Riechert et al. | 257/194 |
| 6,046,464 | A | 4/2000 | Schetzina | 257/96 |
| 6,064,082 | A | 5/2000 | Kawai et al. | 257/192 |
| 6,072,189 | A | 6/2000 | Duggan | 257/14 |
| 6,086,673 | A | 7/2000 | Molnar | |
| 6,121,121 | A | 9/2000 | Koide | 438/481 |
| 6,150,680 | A | 11/2000 | Eastman et al. | |
| 6,165,874 | A | 12/2000 | Powell et al. | 438/478 |
| 6,177,685 | B1 | 1/2001 | Teraguchi et al. | 257/20 |
| 6,194,241 | B1 | 2/2001 | Tsutsui et al. | 438/46 |
| 6,194,742 | B1 | 2/2001 | Kern et al. | 257/94 |
| 6,218,680 | B1 | 4/2001 | Carter, Jr. et al. | |
| 6,316,793 | B1 | 11/2001 | Sheppard et al. | 257/103 |
| 6,429,467 | B1 | 8/2002 | Ando | |
| 6,448,648 | B1 | 9/2002 | Boos | 257/751 |
| 6,452,954 | B2 * | 9/2002 | Fukunaga | 372/46.01 |
| 6,492,669 | B2 | 12/2002 | Nakayama et al. | |
| 6,515,316 | B1 | 2/2003 | Wojtowicz et al. | |
| 6,548,333 | B2 | 4/2003 | Smith | |
| 6,586,781 | B2 | 7/2003 | Wu et al. | |
| 6,639,255 | B2 | 10/2003 | Inoue et al. | 257/194 |
| 6,900,465 | B2 * | 5/2005 | Nakamura et al. | 257/79 |
| 2001/0015446 | A1 | 8/2001 | Inoue et al. | 257/192 |
| 2001/0020700 | A1 | 9/2001 | Inoue et al. | 257/20 |
| 2001/0023964 | A1 | 9/2001 | Wu et al. | 257/368 |
| 2001/0038656 | A1* | 11/2001 | Takeuchi et al. | 372/45 |
| 2001/0040246 | A1 | 11/2001 | Ishii | |
| 2002/0008241 | A1 | 1/2002 | Edmond et al. | |
| 2002/0017696 | A1* | 2/2002 | Nakayama et al. | 257/471 |
| 2002/0020341 | A1 | 2/2002 | Marchand et al. | 117/84 |
| 2002/0066908 | A1 | 6/2002 | Smith | |
| 2002/0070389 | A1* | 6/2002 | Song | 257/194 |
| 2002/0079508 | A1 | 6/2002 | Yoshida | |
| 2002/0119610 | A1 | 8/2002 | Nishii et al. | |
| 2002/0121646 | A1* | 9/2002 | Khare et al. | 257/103 |
| 2002/0167023 | A1 | 11/2002 | Charvarkar et al. | |
| 2003/0017683 | A1 | 1/2003 | Emrick et al. | |
| 2003/0020092 | A1 | 1/2003 | Parikh et al. | |
| 2003/0057434 | A1* | 3/2003 | Hata et al. | 257/103 |
| 2003/0102482 | A1 | 6/2003 | Saxler | |
| 2003/0123829 | A1 | 7/2003 | Taylor | |
| 2003/0145784 | A1 | 8/2003 | Thompson et al. | |
| 2003/0157776 | A1 | 8/2003 | Smith | |
| 2003/0213975 | A1 | 11/2003 | Hirose et al. | |
| 2004/0004223 | A1 | 1/2004 | Nagahama et al. | |
| 2004/0021152 | A1 | 2/2004 | Nguyen et al. | |
| 2004/0029330 | A1 | 2/2004 | Hussain et al. | |
| 2004/0241970 | A1 | 12/2004 | Ring | |

FOREIGN PATENT DOCUMENTS

| | | |
|---|---|---|
| EP | 0 563 847 A2 | 10/1993 |
| JP | 03-132016 | 6/1991 |
| JP | 10-050982 | 2/1998 |
| JP | 11-274474 * | 8/1999 |
| JP | 11261053 | 9/1999 |
| JP | 11-274474 | 10/1999 |
| JP | 2001-085674 | 3/2001 |
| JP | 2001-111037 | 4/2001 |
| JP | 2001-111039 | 4/2001 |
| JP | 02001230407 A | 8/2001 |
| JP | 02002016087 | 1/2002 |
| JP | 2002-076024 | 3/2002 |
| JP | 2003-059948 | 2/2003 |
| JP | 2004-342810 | 12/2004 |
| WO | WO 93/23877 | 11/1993 |
| WO | WO 01/57929 A1 | 8/2001 |
| WO | WO 02/13245 A1 | 2/2002 |
| WO | WO 02/48434 A2 | 6/2002 |
| WO | WO 03/049193 A1 | 6/2003 |
| WO | WO 2004/008495 | 1/2004 |

OTHER PUBLICATIONS

Weighted fuction: http://en.wikipedia.org/wiki/Weight_function.*
Total sum of squares : http://en.wikipedia.org/wiki/Total_sum_of_squares.*
Beaumont, B. et al., "Epitaxial Lateral Overgrowth of GaN," *Phys. Stat. Sol.* (b) 227, No. 1, pp. 1-43 (2001).
Ando et al., "10-W/mm AIGaN-GaN HFET With a Field Modulating Plate," *IEEE Electron Device Letters*, 24(5), pp. 289-291 (May 2003).
Chang et al., "AIGaN/GaN Modulation-Doped Field-Effect Transistors with an Mg-doped Carrier Confinement Layer," *Jpn. J. Appl. Phys.*, 42:3316-3319 (2003).
Chini et al., "Power and Linearity Characteristics of Field-Plagted Recessed-Gate AIGaN-GaN HEMTs," *IEEE Electron Device Letters*, 25(5), pp. 229-231 (May 2004).
Cho et al., "A New GaAs Field Effect Transistor (FET) with Dipole Barrier (DIB)," *Jpn. J. Appl. Phys.* 33:775-778 (1994).
Coffie et al., Unpassivated p-GaN/AIGaN/GaN HEMTs with 7.1 W/MMF at 10 GHz, *Electronic Letters* online No. 20030872, 39(19), (Sep. 18, 2003).
Gaska et al., "Self-Heating in High-Power AIGaN/GaN HFETs," *IEEE Electron Device Letters*, 19(3), pp. 89-91 (Mar. 1998).
Hikita et al., "350V/150A AIGaN/GaN Power HFET on Silicon Substrate With Source-via Grouding (SVG) Structure," *Electron Devices Meeting*, 2004, pp. 803-806, IEDM Technical Digest. IEEE Internatiorral (Dec. 2004).
Kanaev et al., "Femtosecond and Ultraviolet Laser Irradiation of Graphitelike Hexagonal Boron Nitride," *Journal of Applied Physics*, 96(8), pp. 4483-4489 (Oct. 15, 2004).
Kanamura et al., "A 100-W High-Gain AIGaN/GaN HEMT Power Amplifier on a Conductive N-SiC Substrate for Wireless Base Station Applications," *Electron Devices Meeting*, 2004, pp. 799-802, IEDM Technical Digest. IEEE International (Dec. 2004).
Karmalkar et al., "Very High Voltage AIGaN/GaN High Electron Mobility Transistors Using a Field Plate Deposited on a Stepped Insulator," *Solid State Electronics*, vol. 45, pp. 1645-1652 (2001).
Kashahara et al., "Ka-ban 2.3W Power AIGaN/GaN Heterojunction FET," *IEDM Technical Digest*, pp. 677-680 (2002).
Komiak et al., "Fully Monolithic 4 Watt High Efficiency Ka-band Power Amplifier," *IEEE MTT-S International Microwave Symposium Digest*, vol. 3, pp. 947-950 (1999).
Küsters et al., "Double-Heterojunction Lattice-Matched and Pseudomorphic InGaAs HEMT with δ-Doped InP Supply Layers and p-InP Barrier Enhancement Layer Grown by LP-MOVPE," *IEEE Electron Device Letters*, 14(1), (Jan. 1993).
Manfra et al., "Electron Mobility Exceeding 160 000 cm$^2$/V s in AIGaN/GaN Heterostructures Grown by Molecular-beam Epitaxy," *Applied Physics Letters*, 85(22), pp. 5394-5396 (Nov. 29, 2004).

Manfra et al., "High Mobility AlGaN/GaN Heterostructures Grown by Plasma-assisted Molecular beam epitaxy on Semi-Insulating GaN Templates Prepared by Hydride Vapor Phase Epitaxy," *Journal of Applied Physics*, 92(1), pp. 338-345 (Jul. 1, 2002).

Manfra et al., "High-Mobility AlGaN/GaN Heterostructures Grown by Molecular-beam Epitaxy on GaN Templates Prepared by Hydride Vapor Phase Epitaxy," *Applied Physics Letters*, 77(18), pp. 2888-2890 (Oct. 30, 2000).

Parikh et al., "Development of Gallium Nitride Epitaxy and Associated Material-Device Correlation for RF, Microwave and MM-wave Applications," Cree Inc. (35 slides).

Saxler et al., "III-Nitride Heterostructures on High-Purity Semi-Insulating 4H-SiC Substrates for High-Power RF Transistors," International Workshop on Nitride Semiconductors (Jul. 19, 2004).

Shiojima et al., "Improved Carrier Confinement by a Buried p-Layer in the AlGaN/GaN HEMT Structure," *IEICE Trans. Electron.*, E83-C(12), (Dec. 2000).

"Thick AlN template on SiC substrate—Novel semi insulating substrate for GaN-based devices," © 2003 by TDI, Inc., http://www.tdii.com/products/AlN_SiCT.html.

Tilak et al., "Influence of Barrier Thickness on the High-Power Performance of AlGaN/GaN HEMTs," *IEEE Electron Device Letters*, 22(11), pp. 504-506 (Nov. 2001).

United States Patent Application entitled "Improved Dielectric Passivation for Semiconductor Devices," U.S. Appl. No. 10/851,507, filed May 22, 2004.

United States Patent Application entitled "Silicon Carbide on Diamond Substrates and Related Devices and Methods," U.S. Appl. No. 10/707,898, filed Jan. 22, 2004.

United States Patent Application entitled "Methods of Fabricating Nitride-Based Transistors with a Cap Layer and a Recessed Gate," U.S. Appl. No. 10/897,726, filed Jul. 23, 2004.

United States Patent Application entitled "High Power Density and/or Linearity Transistors," U.S. Appl. No. 11/005,107, filed Dec. 6, 2004.

United States Patent Application entitled "Field Effect Transistors (FETS) Having Multi-Watt Output Power at Millimeter-Wave Frequencies," U.S. Appl. No. 11/005,423, filed Dec. 6, 2004.

United States Patent Application entitled "Group III Nitride Field Effect Transistors (FETs) Capable of Withstanding High Temperature Reverse Bias Test Conditions," U.S. Appl. No. 11/080,905, filed Mar. 15, 2005.

United States Patent Application entitled "Aluminum Free Group III-Nitride Based High Electron Mobility Transistors and Methods of Fabricating Same," U.S. Appl. No. 11/118,575, filed Apr. 29, 2005.

United States Patent Application entitled "Binary Group III-Nitride Based High Electron Mobility Transistors and Methods of Fabricating Same," U.S. Appl. No. 11/118,675, filed Apr. 29, 2005.

United States Patent Application entitled "Composite Substrates of Conductive and Insulating or Semi-Insulating Group III-Nitrides for Group III-Nitride Devices," U.S. Appl. No. 11/103,127, filed Apr. 11, 2005.

United States Patent Application entitled "Thick Semi-Insulating or Insulating Epitaxial Gallium Nitride Layers and Devices Incorporating Same," U.S. Appl. No. 11/103,117, filed Apr. 11, 2005.

United States Patent Application entitled "Cap Layers and/or Passivation Layers for Nitride-Based Transistors, Transistor Structures and Methods of Fabricating Same," U.S. Appl. No. 10/996,249, filed Nov. 23, 2004.

Walker, J. L. B. (Ed.), *High Power GaAs FET Amplifiers*, Norwood, MA: Artech House, pp. 119-120 (1993).

Wu et al., "3.5-Watt AlGaN/GaN HEMTs and Amplifiers at 35 GHz," IEDM-2003, Cree, Inc.

Wu et al., "3.5-Watt AlGaN/GaN HEMTs and Amplifiers at 35 GHz," Cree Santa Barbara Technology Center, Goleta, CA 93117.

Wu et al., "30-W/mm GaN HEMTs by Field Plate Optimization," *IEEE Electron Device Letters*, 25(3), pp. 117-119 (Mar. 2004).

Wu et al., "Bias-dependent Performance of High-Power AlGaN/GaN HEMTs," *IEDM Technical Digest*, p. 378-380 (2001).

Wu et al., "Linearity Performance of GaN HEMTs With Field Plates," DRC 2004, Cree, Inc.

Wu et al., "Linearity Performance of GaN HEMTs With Field Plates," Cree Santa Barbara Technology Center, Goleta, CA 93117.

Yu et al., "Schottky Barrier Engineering in III-V Nitrides via the Piezoelectric Effect," *Applied Physics Letters*, 73(13), pp. 1880-1882 (Sep. 28, 1998).

Zhang et al., "High Breakdown GaN HEMT with Overlapping Gate Structure," *IEEE Electron Device Letters*, 21(9), pp. 421-423 (Sep. 2000).

Ambacher et al. "Two-dimensional electron gases induced by spontaneous and piezoelectric polarization charges in N- and Ga-face AlGaN/GaN heterostructures," *Journal of Applied Physics*. vol. 85, No. 6, Mar. 15, 1999.

Ben-Yaacov et al., "AlGaN/GaN Current Aperture Vertical Electron Transistors with Regrown Channels," *Journal of Applied Physics*. vol. 95, No. 4, pp. 2073-2078 (2004).

Breitschadel et al. "Minimization of Leakage Current of Recessed Gate AlGaN/GaN HEMTs by Optimizing the Dry-Etching Process," *Journal of Electronic Materials*. vol. 28, No. 12, pp. 1420-1423 (1999).

Burm et al. "Recessed Gate GaN MODFETS," *Solid-State Electronics*. vol. 41, No. 2, pp. 247-250 (1997).

Burm et al. "Ultra-Low Resistive Ohmic Contacts on $n$-GaN Using Si Implantation," *Applied Physics Letters*. vol. 70, No. 4, 464-66 (1997).

Chen et al. "Cl2 reactive ion etching for gate recessing of AlGaN/GaN field-effect transistors," *J. Vac. Sci. Technol. B*. vol. 17, No. 6, pp. 2755-2758 (1999).

Gaska et al. "Electron Transport in AlGaN/GaN Heterostructures Grown on 6H-SiC Substrates," *Applied Physics Letters*. vol. 72, No. 6, pp. 707-709 (Feb. 1998).

Gelmont et al. "Monte Carlo simulation of electron transport in gallium nitride," *Journal of Applied Physics*. vol. 74, No. 3, pp. 1818-1821 (Aug. 1993).

Heikman, et al., "Mass Transport Regrowth of GaN for Ohmic Contacts to AlGaN/GaN," *Applied Physics Letters*. vol. 78, No. 19, pp. 2876.

Heikman et al., "Growth of Fe-Doped Semi-insulating GaN by Metalorganic Chemical Vapor Deposition," *Applied Physics Letters*. vol. 83, No. 1, pp. 439-441 (Jul. 2002).

Heikman, Sten J., *MOCVD Growth Technologies for Applications in AlGaN/GaN High Electron Mobility Transistors*, Dissertation, University of California—Santa Barbara, Sep. 2002, 190 pages.

Karmalkar et al. "Enhancement of Breakdown Voltage in AlGaN/GaN High Electron Mobility Transistors Using a Field Plate," *IEEE Transactions on Electron Devices*. vol. 48, No. 8, pp. 1515-1521 (Aug. 2001).

Shen et al., "High-Power Polarization-Engineered GaN/AlGaN/GaN HEMTs Without Surface Passivation," *IEEE Electronics Device Letters*. vol. 25, No. 1, pp. 7-9 (2004).

United States Patent Application entitled "Nitride-Based Transistors with a Protective Layer and a Low-Damage Recess and Methods of Fabrication Thereof," U.S. Appl. No. 10/758,871, filed Jan. 16, 2004.

United States Patent Application entitled "Nitride Heterojunction Transistors Having Charge-Transfer Induced Energy Barriers and Methods of Fabricating the Same," U.S. Appl. No. 10/772,882, filed Feb. 5, 2004.

United States Patent Application entitled "Semiconductor Devices Having a Hybrid Channel Layer, Current Aperture Transistors and Methods of Fabricating the Same," U.S. Appl. No. 10/849,589, filed May 20, 2004.

United States Patent Application entitled "Methods of Fabricating Nitride-Based Transistors Having Regrown Ohmic Contact Regions and Nitride-Based Transistors Having Regrown Ohmic Contact Regions," U.S. Appl. No. 10/849,617, filed May 20, 2004.

United States Patent Application entitled "Methods of Fabricating Nitride-Based Transistors with a Cap Layer and a Recessed Gate," filed Jul. 23, 2004.

United States Patent Application entitled "Methods of Having Laterally Grown Active Region and Methods of Fabricating Same," filed Jul. 26, 2004.

United States Patent Application entitled "Silicon Carbide on Diamond Substrates and Related Devices and Methods."

Asbeck et al. "Piezoelectric charge densities in AlGaN/GaN HFETs," *Electronics Letters*. vol. 33, No. 14, pp. 1230-1231, 1997.

Eastman et al. "GaN materials for high power microwave amplifiers," *Mat. Res. Soc. Symp. Proc.* vol. 512 (1998).

Eastman et al. "Undoped AlGaN/GaN HEMTs for Microwave Power Amplification," *IEEE Transactions on Electron Devices*. vol. 48, No. 3, Mar. 2001, pp. 479-485.

Egawa et al. "Recessed gate AlGaN/GaN modulation-doped field-effect transistors on sapphire," *Applied Physics Letters*, vol. 76, No. 1, Jan. 3, 2000, pp. 121-123.

Gaska et al. "High-Temperature Performance of AlGaN/GaN HFET's on SiC Substrates," *IEEE Electron Device Letters*. vol. 18, No. 1, p. 492, Oct. 1997.

Heikman et al., "Polarization Effects in AlGaN/GaN and GaN/AlGaN/GaN heterostructures", Journal of Applied Physics, vol. 93, No. 12, Jun. 15, 2003, pp. 10114-10118.

Karmalkar et al., "Resurf AlGaN/GaN HEMT for High Voltage Power Switching", *IEEE Electron Device Letters*, vol. 22, No. 8, Aug. 2001, pp. 373-375.

Kuzmik et al. "Annealing of Schottky contacts deposited on dry etched AlGaN/GaN," *Semiconductor Science and Technology*. vol. 17, No. 11, Nov. 2002.

Neuburger et al. "Design of GaN-based Field Effect Transistor Structures based on Doping Screening of Polarization Fields," WA 1.5, 7th Wide-Bandgap III-Nitride Workshop, Mar. 2002.

Ping et al. "DC and Microwave Performance of High-Current AlGaN/GaN Heterostructure Field Effect Transistors Grown on P-Type SiC Substrates," *IEEE Electron Letters*. vol. 19, No. 2, p. 54, Feb. 1998.

Sheppard et al. U.S. Appl. No. 09/096,967 entitled, *Nitride Based Transistors on Semi-Insulating Silicon Carbide Substrates*, filed Jun. 12, 1998.

Sheppard et al. "High Power Demonstration at 10 GHz with GaN/AlGaN HEMT Hybrid Amplifiers." Presented at the 58th DRC, Denver, CO, Jun. 2000.

Sriram et al. "RF Performance of AlGaN/GaN MODFET's on High Resistivity SiC Substrates," Presentation at Materials Research Society Fall Symposium, 1997.

Sriram et al. "SiC and Wide Bandgap Microwave Power Transistors," *IEEE Sarnoff Symposium*, Mar. 18, 1998.

Wu et al., "30-W/mm AlGaN/GaN HEMTs by Field Plate Optimization", *IEEE Electron Device Letters*, Published 2004.

Bharatan et al. "Structural characterization of GaN and $GaAs_xN_{1-x}$, grown by electron cyclotron resonance-metalorganic molecular beam epitaxy," *J. Vac. Sci. Technol. A* vol. 12, No. 4, Jul. 1994.

Kim et al. "Effects of step-graded $Al_xGa_{1-x}N$ interlayer on properties of GaN grown on Si(111) using ultrahight vacuum chemical vapor deposition," *Applied Physics Letters*, vol. 79, No. 17, Oct. 22, 2001.

Marchand et al. "Metalorganic Chemical Vapor Deposition of GaN on Si(111): Stress Control and Application to Field-Effect Transistors," *Journal of Applied Physics*, vol. 89, No. 12, Jun. 15, 2001.

Molina et al. "Strain relief in linearly graded composition buffer layers: a design scheme to grow dislocation-free ($<10^5$ cm$^{-2}$) and unstrained epilayers," *Applied Physics Letters* vol. 65, No. 19, Nov. 7, 1994.

Tan et al. "$N_2O$ oxidation of strained-Si/relaxed-SiGe heterostructure grown by UHVCVD," *Solid State Electronics*, vol. 45 (2001) pp. 1945-1949.

Marchand et al. "Metalorganic chemical vapor deposition of GaN on Si(111): Stress control and application to field-effect transistors," *Journal of Applied Physics* vol. 89, No. 12, Jun. 15, 2001, pp. 7846-7851.

Waldrip et al. "Stress engineering during metalorganic chemical vapor deposition of AiGaN/GaN distributed Bragg reflectors." *Applied Physics Letters*. vol. 78, No. 21, May 21, 2001, pp. 3205-3207.

Etzkorn et al. "Cracking of GaN films," *Journal of Applied Physics*, vol. 89, No. 2, Jan. 15, 2001, pp. 1025-1034.

Sullivan et al. "High-Power 10-Ghz Operation of AlGaN HFET's on Insulating SiC," *IEEE Electron Device Letters*. vol. 19, No. 6. Jun. 1998, pp. 198-200.

Sheppard et al. "Improved 10-Ghz Operation of GaN/AlGaN HEMTs on Silicon Carbide," *Materials Science Forum*, vols. 338-42 (2000). pp. 1645-1646.

Wu et al. "High Al-Content AlGaN/GaN MODFET's for Ultrahigh Performance," *IEEE Electron Device Letters*. vol. 19, No. 2. Feb. 1998.

Yu et al. "Schottky barrier engineering in III-V nitrides via the piezoelectric effect," *Applied Physics Letters*, vol. 73, No. 13, Sep. 28, 1998, pp. 1880-1882.

Kim et al. "Effects of step-graded $Al_{x-x}N$ interlayer on properties of GaN grown on Si(111) using ultrahigh vacuum chemical vapor deposition," *Applied Physics Letters*, vol. 79, No. 17, Oct. 22, 2001, pp. 2713-2715.

International Search Report for PCT/US02/37244 dated Apr. 4, 2003.

Office Action and English Translation corresponding to Japanese Application No. 2003-550289 mailed Sep. 29, 2009, (10 pages).

Japanese Office Action for corresponding application No. 2003-550289 mailed on Jun. 4, 2010 with translation.

* cited by examiner

PRIOR ART

Figure 4

METHODS OF FABRICATING STRAIN BALANCED NITRIDE HETEROJUNCTION TRANSISTORS

RELATED APPLICATIONS

The present application is a divisional application of and claims priority from U.S. patent application Ser. No. 10/199,786, filed Jul. 19, 2002 now U.S. Pat. No. 7,030,428, which is related to and claims priority from U.S. Provisional Application Ser. No. 60/337,687, filed Dec. 3, 2001 and entitled "Strain Balanced Nitride Heterojunction Transistor" the disclosures of which are incorporated herein as if set forth fully herein.

FIELD OF THE INVENTION

The present invention relates to high frequency transistors and in particular relates to a high electron mobility transistor (HEMT) that incorporates nitride-based active layers.

BACKGROUND

The present invention relates to transistors formed of semiconductor materials that can make them suitable for high power, high temperature, and/or high frequency applications. Materials such as silicon (Si) and gallium arsenide (GaAs) have found wide application in semiconductor devices for lower power and (in the case of Si) lower frequency applications. These, more familiar, semiconductor materials may not be well suited for higher power and/or high frequency applications, however, because of their relatively small bandgaps (e.g., 1.12 eV for Si and 1.42 for GaAs at room temperature) and/or relatively small breakdown voltages.

In light of the difficulties presented by Si and GaAs, interest in high power, high temperature and/or high frequency applications and devices has turned to wide bandgap semiconductor materials such as silicon carbide (2.996 eV for alpha SiC at room temperature) and the Group III nitrides (e.g., 3.36 eV for GaN at room temperature). These materials, typically, have higher electric field breakdown strengths and higher electron saturation velocities as compared to gallium arsenide and silicon.

A device of particular interest for high power and/or high frequency applications is the high electron mobility transistor (HEMT), which is also known as a modulation doped field effect transistor (MODFET). These devices may offer operational advantages under a number of circumstances because a two-dimensional electron gas (2DEG) is formed at the heterojunction of two semiconductor materials with different bandgap energies, and where the smaller bandgap material has a higher electron affinity. The 2DEG is an accumulation layer in the undoped, smaller bandgap material and can contain a very high sheet electron concentration in excess of, for example, $10^{13}$ carriers/cm². Additionally, electrons that originate in the wider-bandgap semiconductor transfer to the 2DEG, allowing a high electron mobility due to reduced ionized impurity scattering.

This combination of high carrier concentration and high carrier mobility can give the HEMT a very large transconductance and may provide a strong performance advantage over metal-semiconductor field effect transistors (MESFETs) for high-frequency applications.

High electron mobility transistors fabricated in the gallium nitride/aluminum gallium nitride (GaN/AlGaN) material system have the potential to generate large amounts of RF power because of the combination of material characteristics that includes the aforementioned high breakdown fields, their wide bandgaps, large conduction band offset, and/or high saturated electron drift velocity. A major portion of the electrons in the 2DEG is attributed to polarization in the AlGaN.

HEMTs in the GaN/AlGaN system have already been demonstrated. U.S. Pat. Nos. 5,192,987 and 5,296,395 describe AlGaN/GaN HEMT structures and methods of manufacture. U.S. Pat. No. 6,316,793, to Sheppard et al., which is commonly assigned and is incorporated herein by reference, describes a HEMT device having a semi-insulating silicon carbide substrate, an aluminum nitride buffer layer on the substrate, an insulating gallium nitride layer on the buffer layer, an aluminum gallium nitride barrier layer on the gallium nitride layer, and a passivation layer on the aluminum gallium nitride active structure.

One limiting factor in the design of nitride-based HEMTs may be the aluminum concentration and thickness of the AlGaN barrier layer. In order to increase or maximize carrier concentration in the channel layer, it is desirable to have a relatively thick AlGaN barrier layer having a relatively high aluminum content. As described above, the AlGaN barrier layer is the source of carriers in the two dimensional electron gas. Accordingly a thicker barrier layer can supply more carriers to the channel. In addition, thicker AlGaN layers with higher aluminum compositions are capable of producing larger piezoelectric fields and more spontaneous charge, that contribute to the formation of the two dimensional electron gas with high carrier concentration. However, thick AlGaN layers with high aluminum content tend to crack either during growth or after cooling, which destroys the device.

SUMMARY OF THE INVENTION

Embodiments of the present invention provide a nitride based heterojunction transistor including a substrate and a first AlGaN based layer on the substrate. The first AlGaN based layer has an associated first strain energy. A GaN based layer is on the first AlGaN based layer. The GaN based layer has a bandgap that is less than a bandgap of the first AlGaN based layer and has an associated second strain energy. The second strain energy has a magnitude that is greater than a magnitude of the first strain energy. A second AlGaN based layer is on the GaN layer. The second AlGaN based layer has a bandgap that is greater than the bandgap of the GaN based layer and has an associated third strain energy. The third strain energy is of opposite strain type to the second strain energy. A source contact, a drain contact and a gate contact may also be provided on the second AlGaN based layer.

In additional embodiments of the present invention, an AlN layer is provided on the GaN based layer and disposed between the GaN based layer and the second AlGaN based layer. In certain embodiments, the first AlGaN based layer is a short period super-lattice of AlN based layers and GaN based layers. In such embodiments, the AlN based layers and the GaN based layers of the short period super-lattice may be AlN layers and GaN layers respectively. The second AlGaN based layer may also be an $Al_xGa_{1-x}N$ layer, where $0 < x \leq 1$.

In further embodiments of the present invention, the first AlGaN based layer is a bottom confinement layer, the GaN layer is a channel layer and the second AlGaN based layer is a barrier layer. In further embodiments, the bottom confinement layer has a first aluminum concentration and the barrier layer has a second aluminum concentration different from the first aluminum concentration. The second aluminum concentration may be greater than the first aluminum concentration.

In additional embodiments of the present invention, the second AlGaN based layer has a thickness and aluminum concentration large enough to induce formation of a 2D electron gas at the interface with the GaN based layer, but less than a thickness at which cracking or defect formation occurs. In particular embodiments of the present invention, the second AlGaN layer has a thickness of at least about 10 nm.

In other embodiments of the present invention, the total strain energy in the first AlGaN based layer, the GaN based layer and the second AlGaN based layer at a growth temperature is approximately zero.

In still further embodiments of the present invention, the first AlGaN based layer, the GaN layer and the second AlGaN based layer are substantially coherently strained in the "a" crystal lattice direction.

In additional embodiments of the present invention, a buffer layer is provided between the substrate and the first AlGaN based layer. The buffer layer may be an AlN layer.

In other embodiments of the present invention, the GaN based layer is directly on the first AlGaN based layer. The second AlGaN based layer may also be directly on the GaN based layer. The first AlGaN based layer may be a graded AlGaN based layer. The first AlGaN based layer may also be an AlGaN layer. Alternatively, the first AlGaN based layer may be an AlInGaN layer.

In certain embodiments of the present invention, the first AlGaN based layer has an aluminum percentage of greater than about 10%. The second AlGaN based layer may also have an aluminum percentage of greater than about 20%. The first AlGaN based layer may have a thickness of at least about 1000 nm. The GaN based layer may have a thickness of from about 30 Å to about 300 Å. Alternatively, the GaN based layer may have a thickness of greater than about 500 Å. Furthermore, in certain embodiments, the substrate may be a silicon carbide substrate, a sapphire substrate, an AlN substrate and/or a silicon substrate.

In further embodiments of the present invention, a method of fabricating a nitride based heterojunction transistor is provided by forming a substantially unstrained AlGaN based layer on a substrate, forming a compressive strained GaN based layer on the substantially unstrained AlGaN based layer and forming a tensile strained AlGaN based layer on the compressive strained GaN based layer. The tensile strained AlGaN based layer may be formed having a predefined tensile strain on the compressive strained GaN based layer. The predefined tensile strain may provide a tensile strain such that a total strain energy of the compressive strained GaN based layer and the tensile strained AlGaN based layer is about zero. The predefined tensile strain may be provided by adjusting the thickness of the tensile strained AlGaN based layer, a composition of the substantially unstrained AlGaN based layer and/or an aluminum concentration in the tensile strained AlGaN based layer to provide the predefined tensile strain.

In additional embodiments of the present invention, the substantially unstrained AlGaN based layer is formed by forming three dimensional islands of AlGaN based material on the substrate and growing the AlGaN based material so that the AlGaN based material coalesces between the three dimensional islands to provide the substantially unstrained AlGaN based layer. The substantially unstrained AlGaN based layer may be a substantially unstrained AlGaN layer. Alternatively, the substantially unstrained AlGaN based layer may be a substantially unstrained AlInGaN layer. The tensile strained AlGaN based layer may be a tensile strained AlGaN layer. Alternatively, the tensile strained AlGaN based layer may be a tensile strained AlInGaN layer. Furthermore, the tensile strained AlGaN based layer may have a thickness of at least 10 nm. The compressive strained GaN based layer may have a thickness of from about 30 Å to about 300 Å. Alternatively, the compressive strained GaN based layer may have a thickness of greater than about 500 Å.

In still further embodiments of the present invention, the substantially unstrained AlGaN based layer is formed by forming a substantially unstrained AlGaN based layer having a first aluminum concentration and the tensile strained AlGaN based layer is formed by forming a tensile strained AlGaN based layer having a second aluminum concentration different from the first aluminum concentration. In particular embodiments, the second aluminum concentration is greater than the first aluminum concentration. Furthermore, the tensile strained AlGaN based layer may be provided by forming a tensile strained AlGaN based layer having a thickness and aluminum concentration large enough to induce formation of a 2D electron gas at the interface with the compressive strained GaN based layer, but less than a thickness at which cracking or defect formation occurs.

In additional embodiments of the present invention, a nitride based heterojunction transistor includes an AlGaN based bottom confinement layer, a GaN based channel layer on the bottom confinement layer and an AlGaN based barrier layer on the channel layer. The barrier layer has a higher concentration of aluminum than the bottom confinement layer. The channel layer may have a thickness of from about 30 Å to about 300 Å. The barrier layer may have a thickness of at least about 10 nm. The bottom confinement layer may be provided, for example, on a silicon carbide substrate, a sapphire substrate, an AlN substrate and/or a silicon substrate. An AlN buffer layer between the silicon carbide substrate and the bottom confinement layer may also be provided. The bottom confinement layer may also be a graded AlGaN based layer. A GaN based contact layer may be provided on the barrier layer. The bottom confinement layer and the barrier layer may each have an aluminum concentration of greater than about 10%. Methods of fabricating such transistors are also provided.

In still further embodiments of the present invention, a Group III-nitride based heterojunction transistor structure is provided having a substrate and a first Group III-nitride based layer on the substrate, the first Group III-nitride based layer having a first strain associated therewith. A second Group III-nitride based layer is on the first Group III-nitride based layer. The second Group III-nitride based layer has a bandgap that is less than a bandgap of the first Group III-nitride based layer and has a second strain associated therewith. The second strain has a magnitude that is greater than a magnitude of the first strain. A third Group III-nitride based layer is on the second Group III-nitride based layer opposite the first Group III-nitride based layer. The third Group III-nitride based layer has a bandgap that is greater than the bandgap of the second Group III-nitride based layer and has a third strain associated therewith, the third strain being of opposite strain type to the second strain. In additional embodiments of the present invention, the first Group III-nitride based layer is an $Al_xGa_{1-x}N$ layer, where $0<x\leq1$. The second Group III-nitride based layer may be a GaN layer. The third Group III-nitride base layer may be an AlN layer. Methods of fabricating such transistors are also provided.

DETAILED DESCRIPTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements-throughout. Furthermore, the various layers and regions illustrated in the figures are illustrated schematically. Accordingly, the present invention is not limited to the relative size and spacing illustrated in the accompanying figures. As will also be appreciated by those of skill in the art, references herein to a layer formed "on" a substrate or other layer may refer to the layer formed directly on the substrate or other layer or on an intervening layer or layers formed on the substrate or other layer.

Figure 1:
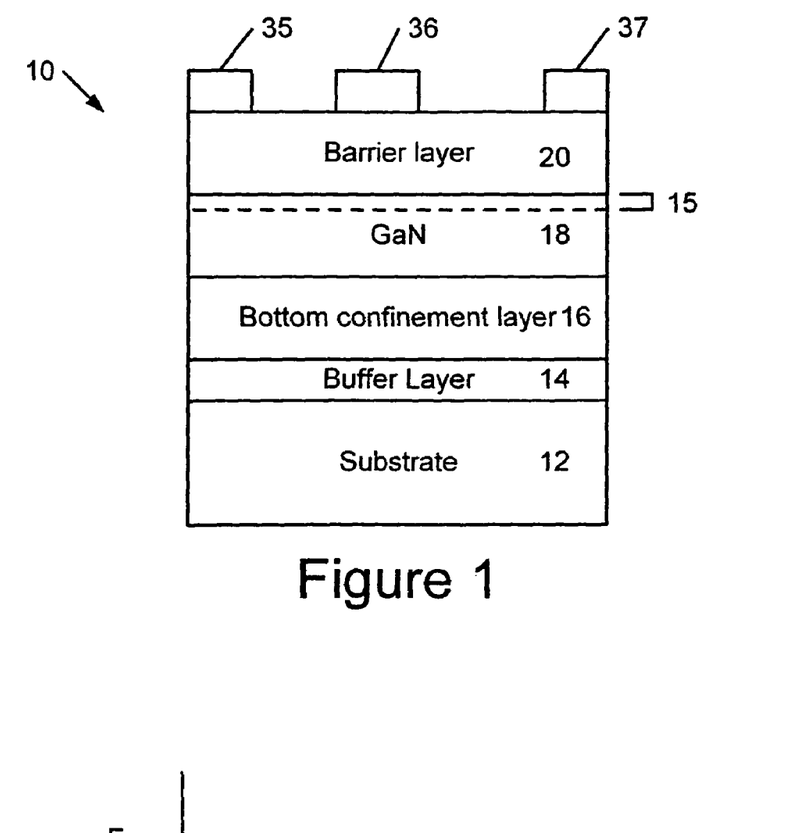
FIG. 1 is a schematic drawing showing a transistor according to embodiments of the present invention.

Embodiments of the present invention are schematically illustrated as a high electron mobility transistor (HEMT) 10 in the cross-sectional view of FIG. 1. The transistor 10 includes a semi-insulating silicon carbide (SiC) substrate 12 that may be, for example, 4H polytype of silicon carbide. Other silicon carbide candidate polytypes include the 3C, 6H, and 15R polytypes. The term "semi-insulating" is used descriptively rather than in an absolute sense. In particular embodiments of the present invention, the silicon carbide bulk crystal has a resistivity equal to or higher than about $1 \times 10^5$ Ω-cm at room temperature.

An optional aluminum nitride buffer layer 14 is on the substrate 12 and provides an appropriate crystal structure transition between the silicon carbide substrate and the remainder of the device. Silicon carbide has a much closer crystal lattice match to Group III nitrides than does sapphire ($Al_2O_3$), which is a very common substrate material for Group III nitride devices. The closer lattice match may result in Group III nitride films of higher quality than those generally available on sapphire. Silicon carbide also has a very high thermal conductivity so that the total output power of Group III nitride devices on silicon carbide is, typically, not as limited by thermal dissipation of the substrate as in the case of the same devices formed on sapphire. Also, the availability of semi-insulating silicon carbide substrates may provide for device isolation and reduced parasitic capacitance.

Although silicon carbide is the preferred substrate material, embodiments of the present invention may utilize any suitable substrate, such as sapphire, aluminum nitride, aluminum gallium nitride, gallium nitride, silicon, GaAs, LGO, ZnO, LAO, InP and the like. In some embodiments, an appropriate buffer layer also may be formed.

As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds such as AlGaN and AlInGaN. As is well understood by those in this art, the Group III elements can combine with nitrogen to form binary (e.g., GaN), ternary (e.g., AlGaN, AlIiN), and quaternary (e.g., AlInGaN) compounds. These compounds all have empirical formulas in which one mole of nitrogen is combined with a total of one mole of the Group III elements. Accordingly, formulas such as $Al_xGa_{1-x}N$ where $0 \leq x \leq 1$ are often used to describe them.

Appropriate SiC substrates are manufactured by, for example, Cree, Inc., of Durham, N.C., the assignee of the present invention, and the methods for producing are described, for example, U.S. Pat. Nos. Re. 34,861; 4,946,547; 5,200,022; and 6,218,680, the contents of which are incorporated herein by reference in their entirety. Similarly, techniques for epitaxial growth of Group III nitrides have been described in, for example, U. S. Pat. Nos. 5,210,051; 5,393, 993; 5,523,589; and 5,292,501, the contents of which are also incorporated herein by reference in their entirety.

Suitable structures for GaN-based HEMTs are described, for example, in commonly assigned U.S. Pat. No. 6,316,793 and U.S. application Ser. No. 09/904,333 filed Jul. 12, 2001 for "ALUMINUM GALLIUM NITRIDE/GALLIUM NITRIDE HIGH ELECTRON MOBILITY TRANSISTORS HAVING A GATE CONTACT ON A GALLIUM NITRIDE BASED CAP SEGMENT AND METHODS OF FABRICATING SAME," U.S. provisional application Ser. No. 60/290,195 filed May 11, 2001 for "GROUP III NITRIDE BASED HIGH ELECTRON MOBILITY TRANSISTOR (HEMT) WITH BARRIER/SPACER LAYER" and U.S. patent application Ser. No. 10/102,272, to Smorchkova et al., entitled "GROUP-III NITRIDE BASED HIGH ELECTRON MOBILITY TRANSISTOR (HEMT) WITH BARRIER/SPACER LAYER" the disclosures of which are hereby incorporated herein by reference in their entirety.

Returning to FIG. 1, the transistor 10 includes a bottom confinement layer 16 and a channel layer 18. The bottom confinement layer 16 has a bandgap larger than that of channel layer 18. In certain embodiments of the present invention, the bottom confinement layer 16 has a substantially lower strain energy than that of the channel layer 18 and may be substantially relaxed (i.e. substantially unstrained). For example, the bottom confinement layer may have a strain that is about 0 or may have a strain that is from about 0 to about 100% the strain of the channel layer 18. In certain embodiments of the present invention, the bottom confinement layer 16 has a stress of less than about 1 GPa. In some embodiments of the present invention, the bottom confinement layer 16 may comprise a Group III-nitride, such as AlGaN or AlInGaN and the AlGaN and AlInGaN may be substantially free of dopants, such as Si and Mg. The bottom confinement layer 16 may be at least about 1000 nm thick, but is not so thick as to cause cracking or defect formation therein. The bottom confinement layer 16 may be semi-insulating. In certain embodiments, the bottom confinement layer 16 is AlGaN with a substantially uniform aluminum concentration between about 1% and 100%, and preferably greater than 10%. Alternatively, the bottom confinement layer 16 may be graded with an increasing, decreasing and/or increasing and decreasing aluminum concentration to better match the lattice constant of the channel layer 18. The bottom confinement layer 16 may also be a short period super-lattice of alternating layers of AlN and GaN. The term AlGaN based layer may also refer to a super-lattice of AlN and GaN and/or AlGaN and AlN and/or GaN.

The bottom confinement layer 16 may be fabricated as a substantially relaxed layer by forming three dimensional islands on the substrate 12 or the buffer layer 14 and growing the bottom confinement layer 16 such that the AlGaN based material coalesces between the islands. Such growth can provide an AlGaN based layer that is substantially relaxed and does not take on the lattice constant of the underlying substrate. Formation of larger islands may be beneficial in reducing tensile strain.

For example, in certain embodiments of the present invention a semi-insulating AlN layer is deposited at high temperature (>1000° C.) on a semi-insulating SiC substrate as a nucleation/buffer layer. Next, a semi-insulating $Al_xGa_{1-x}N$ layer (x~0.1-0.2) is deposited at high temperature (>1000° C.) on the AlN layer. The growth conditions (such as temperature, pressure, V/III ratio, growth rate, thickness, etc.) are adjusted to ensure that the AlGaN is not coherently strained to the AlN layer. Preferably, the AlGaN will initially begin growth in a three-dimensional mode with a relatively low density of nuclei (<$10^9$ cm$^{-2}$). As would be appreciated by those of skill in the art in light of the present disclosure, the detailed growth conditions may differ depending on reactor geometry and, therefore, may be adjusted accordingly to achieve AlGaN with these properties.

In further embodiments, the $Al_xGa_{1-x}N$ layer is graded with composition x decreasing during the growth. Furthermore, the layers may be grown as described above, but without the AlN layer, such that the AlGaN is grown directly on the SiC substrate in a substantially relaxed manner as described above.

In addition to the optional buffer layer 14, the bottom confinement layer 16 may be formed on or above one or more optional intervening layers (not shown). If such is the case, the strain energy that such intervening layers impart to the overall structure should be taken into account as described below.

In some embodiments of the present invention, the channel layer 18 is a Group III-nitride, such as $Al_xGa_{1-x}N$ where $0 \leq x < 1$, provided that the bandgap of the channel layer 18 is less than the bandgap of the bottom confinement layer 16. In certain embodiments of the present invention, x=0, indicating that the channel layer 18 is GaN. The channel layer 18 may be undoped and may be grown to a thickness of between about 30 and about 300 Å. Thus, the channel layer 18 may be thinner than those in conventional GaN HEMT devices, which are typically greater than 500 Å in thickness. Because of the confinement provided by the bottom confinement layer 16, there may be less "tailing" of carriers into the GaN layer. Thus, the resulting devices may exhibit more linearity than devices found in the prior art. Alternatively, if strain control is a consideration and additional confinement is less of a consideration, the GaN channel layer 18 may be grown thicker than 500 Å and the aluminum percentage in the bottom confinement layer 16 may be reduced.

Furthermore, the interface between the bottom confinement layer 16 and the channel layer 18 may be doped n-type. For example, the portion of the bottom confinement layer 16 adjacent the channel layer may be doped to about $3 \times 10^{12}$ cm$^{-2}$. Such a doping at the interface may counteract the positive charge at the interface. The channel layer 18, or portions thereof adjacent the bottom confinement layer 16, may also be doped n-type.

A barrier layer 20 is provided on the channel layer 18. Like the bottom confinement layer 16, the barrier layer 20 may be a Group III-nitride and has a bandgap larger than that of the channel layer 18 and may be tensile strained as described below. Accordingly, the barrier layer 20 may be AlGaN, AlInGaN and/or AlN. The barrier layer 20 may be at least about 10 nm thick, but is not so thick as to cause cracking or defect formation therein. Preferably, the barrier layer 20 is undoped or doped with a concentration less than about $10^{19}$ cm$^{-3}$. In some embodiments of the present invention, the barrier layer 20 is $Al_xGa_{1-x}N$ where $0 < x \leq 1$. In certain embodiments of the present invention, the barrier layer 20 comprises AlGaN with an aluminum concentration of between about 5% and about 100%. In specific embodiments of the present invention, the aluminum concentration is greater than about 10%. Furthermore, the aluminum concentration in the barrier layer 20 may be greater than the aluminum concentration in the bottom confinement layer 16.

Figure 4:
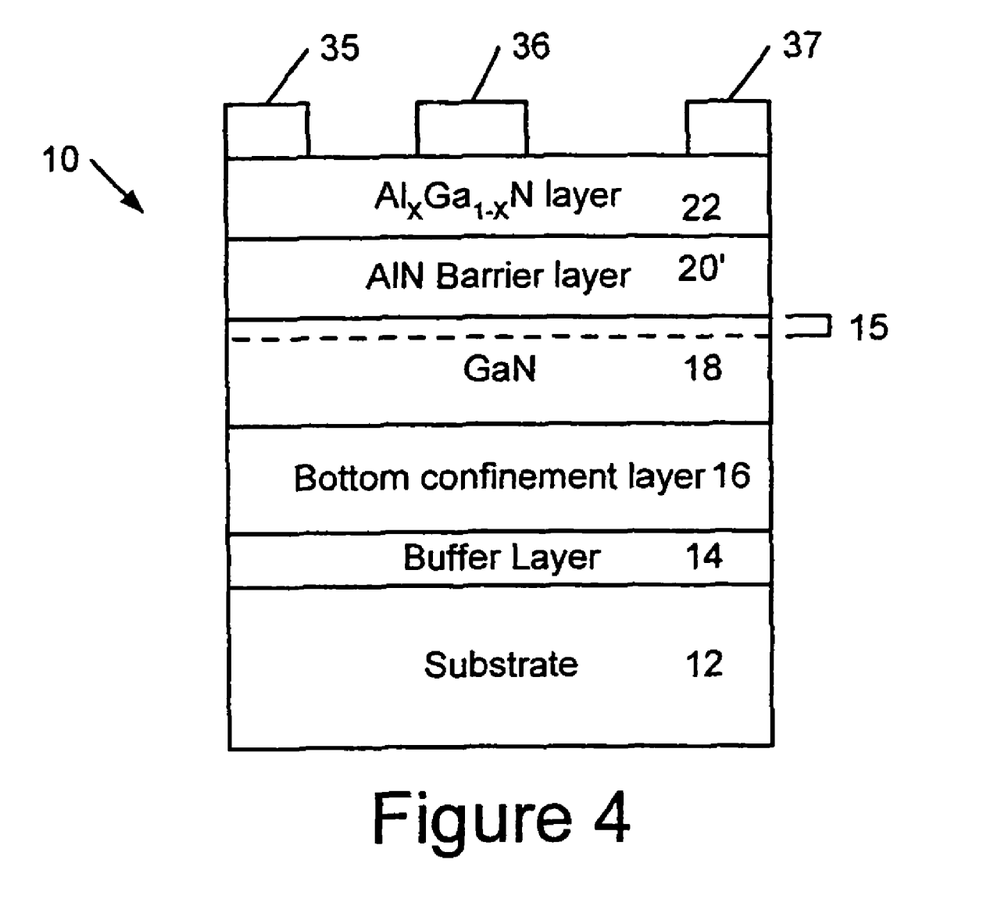
FIG. 4 is a schematic drawing showing a transistor according to further embodiments of the present invention.

The barrier layer may also be provided with multiple layers as described in U.S. patent application Ser. No. 10/102,272, to Smorchkova et al., entitled "GROUP-III NITRIDE BASED HIGH ELECTRON MOBILITY TRANSISTOR (HEMT) WITH BARRIER/SPACER LAYER" the disclosure of which is incorporated herein by reference as if set forth fully herein. Thus, embodiments of the present invention should not be construed as limiting the barrier layer to a single layer but may include, for example, barrier layers having combinations of GaN, AlGaN and/or AlN layers. For example, a GaN, AlN structure may be utilized to reduce or prevent contamination of the GaN layers by contact material that may result in alloy scattering. An example of a structure according to further embodiments of the present invention is illustrated in FIG. 4, where an AlN nitride barrier layer 20' is provided on the GaN based layer 18 and an $Al_xGa_{1-x}N$ layer 22, where $0 \leq x \leq 1$, is provided on the AlN barrier layer 20'. Thus, the AlN barrier layer 20' is provided on the GaN based layer 18 and disposed between the GaN based layer 18 and the AlGaN based layer 22.

An optional GaN contact layer or cap layer (not shown) may be provided on the barrier layer 20 to facilitate the formation of contacts of the transistor 10. An example of such a cap layer is disclosed in U.S. application Ser. No. 09/904, 333 filed Jul. 12, 2001 for "ALUMINUM GALLIUM NITRIDE/GALLIUM NITRIDE HIGH ELECTRON MOBILITY TRANSISTORS HAVING A GATE CONTACT ON A GALLIUM NITRIDE BASED CAP SEGMENT AND METHODS OF FABRICATING SAME," which is referenced above. In addition, there may be a compositionally graded transition layer (not shown) between the barrier layer 20 and the contact or cap layer. The source contact 35, the drain contact 37 and the gate contact 36 may be fabricated as described in U.S. Pat. No. 6,316,793.

Figure 2:
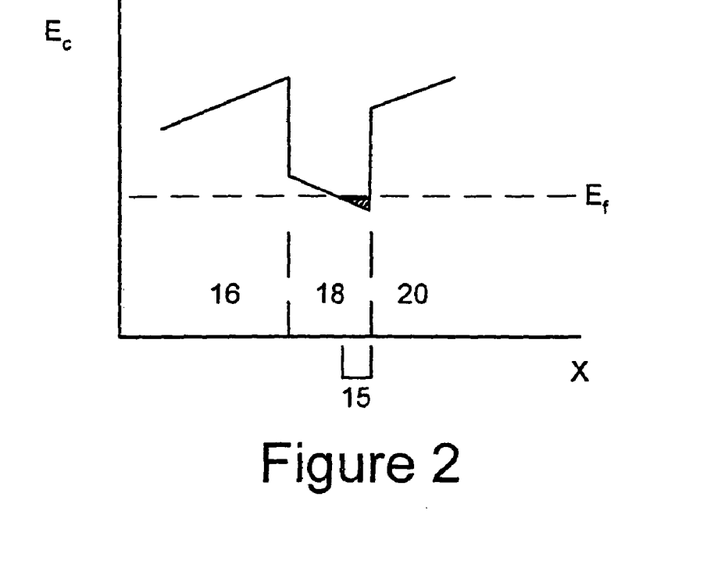
FIG. 2 is a diagram of the band energy of an embodiment of the present invention.

FIG. 2 illustrates the conduction band $E_c$ in the transistor 10 versus height (x). Because of the presence of aluminum in the crystal lattice, AlGaN has a wider bandgap than GaN. Thus, the interface between the channel layer 18 and the barrier layer 20 forms a heterostructure in which the conduction and valence bands $E_c$ and $E_v$ in the barrier layer 20 are offset. Charge is induced due to the piezoelectric effect and spontaneous doping. The conduction band $E_c$ dips below the Fermi level $E_f$ in the area of the channel layer 18 that is immediately adjacent to the barrier layer 20. Consequently, a two dimensional electron gas (2DEG) sheet charge region 15 is induced at the heterojunction between the channel layer 16 and the barrier layer 20, while layer 20 is depleted of mobile carriers due to the shape of the conduction band. However, because of the bandgap lineup and arrangement of piezoelectric charge, a similar sheet charge region is not induced at the interface between the channel layer 18 and the bottom confinement layer 16. Instead, the bottom confinement layer 16 acts to confine mobile carriers in the channel layer 18, thereby increasing the carrier concentration in the channel layer 18. Furthermore, by doping a portion of the bottom confinement layer 16 and/or the channel layer 18, charge at the interface between the bottom confinement layer 16 and the channel layer 18 may be reduced, thereby reducing or eliminating a 2DHG (2D hole gas) region that may form at the interface between the bottom confinement layer 16 and the channel layer 18.

Electrons in the 2DEG sheet charge region 15 demonstrate high carrier mobility. The conductivity of this region is modulated by applying a voltage to the gate electrode 36. When a reverse voltage is applied, the conduction band in the vicinity of conduction layer 15 is elevated above the Fermi level, and a portion of the conduction layer 15 is depleted of carriers, thereby preventing the flow of current from the source 35 to the drain 37.

As discussed above, one shortcoming with conventional HEMT structures is cracking in the AlGaN barrier layer when the layer is grown above a certain critical thickness (which, typically, depends on device geometry, layer structure, growth conditions and other factors). It is desirable to have a thick, high Al-composition AlGaN barrier to increase or maximize carrier density in the 2DEG region 15. One cause of cracking in the barrier layer is accumulated strain energy in the structure. Accordingly, embodiments of the present invention may reduce the overall strain energy in the device by balancing the strain energy components contributed by various layers in the device.

In semiconductor crystal structures, typically, strain effects are present if two different materials are adjacent to one another. As a result, the preferred thickness for an epitaxial layer is a thickness that is appropriate for the other performance parameters of the device, but less than a critical thickness. The critical thickness is, typically, the maximum thickness that the layer can be grown in strained fashion before dislocations or cracks begin to propagate.

The strain ("$\epsilon$") between two layers is often expressed as the difference in the crystal lattice parameters between the two layers ($\Delta a$) divided by the lattice parameter of one of the layers. The higher this strain value, the thinner the layer that can be grown between the two materials. Furthermore, in a multilayer structure such as illustrated in FIG. 1, the overall strain energy ("$\Sigma$") is a function or summation of the individual layer strains, and is referred to as the "effective strain." The overall strain energy or total strain energy may be a linear combination of the strain values or may be a weighted combination of strain energies. For example, the total strain energy may be a weighted sum of the squares of the strain values. Thus, the total strain energy may be proportional to $$\sum_i t_i \varepsilon_i^2$$

where $t_i$ is the thickness of a layer i.

Strain is generally described as being one of two modes, namely tensile or compressive. Compressive strain of a crystal lattice indicates that the crystal lattice is being compressed into a smaller than usual space, while tensile strain indicates that the crystal lattice is being stretched into a larger than usual space. A crystal lattice can withstand only a certain amount of strain, either compressive or tensile, before the lattice bonds begin to fail and cracks appear in the crystal.

In some embodiments of the present invention, the bottom confinement layer 16 acts as a relaxed or nearly relaxed template to define the strain contributed to the device by the channel layer 18 and barrier layer 20. Stated differently, the bottom confinement layer 16 is nearly relaxed; thus, the subsequent epitaxial layers of the transistor 10 inherit the lattice constant of bottom confinement layer 16, and are, therefore, "pseudomorphically strained" to the extent their lattice constant differs from that of the bottom confinement layer 16. The channel layer 18 is compressively strained, while the barrier layer 20 is tensile strained, which tends to balance the average or effective strain in the device.

Furthermore, the specific tensile strain and/or compressive strain of the barrier layer 20 and the channel layer 18 may be controlled by, for example, controlling the aluminum concentration in the respective layers.

As described above, the lattice constants of the bottom confinement layer 16, the channel layer 18 and the barrier layer 20 are substantially the same in the "a" direction (i.e. horizontally across the page in FIG. 1). However, in the "c" direction (i.e. vertically or the thickness or growth direction) the lattice constants differ. Thus, strain is induced into the channel layer 18 and the barrier layer 20. In particular, the unstrained "a" lattice constant of the channel layer 18 is larger than that of the bottom confinement layer 16 and thus, compressive strain is induced in the channel layer 18 as the channel layer 18 attempts to conform to the smaller lattice constant bottom confinement layer 16 on which it is grown. Similarly, the unstrained "a" lattice constant of the channel layer 18 is also larger than that of the barrier layer 20 and thus, tensile strain is induced in the barrier layer 20 as the barrier layer 20 attempts to conform to the larger lattice constant channel layer 18 on which it is grown. While the embodiments illustrated in FIG. 1 are described with regard to particular directions of growth, the present invention should not be construed as limited to such embodiments but may be applied to layers that are coherently strained such that all have the same strained in-plane lattice constant.

In certain embodiments of the present invention, the total strain energy of the transistor 10 is approximately equal to zero. As described above, the total strain energy may be weight average, a non-weighted average, a sum of squares or other such combination of strain energies. Furthermore, the total strain energy may be determined at room temperature. In some embodiments, a non-zero magnitude total strain energy may be provided at a growth temperature such that the total strain energy at room temperature is about zero. Thus, the barrier layer 20 can be grown to a greater thickness than would otherwise be possible for a given amount of strain. As used herein, in some embodiments, the term "approximately zero" total strain energy means a total strain energy of less than a corresponding two layer structure with a lattice mismatch of about 0.1% while in other embodiments, "approximately zero" may mean an total strain energy of less than a corresponding two layer structure with a lattice mismatch of about 1%.

In particular embodiments of the present invention, the bottom confinement layer 16 may be $Al_xGa_{1-x}N$, the channel layer 18 may be a GaN layer with a thickness of $t_{GaN}$ and the barrier layer 20 may be $Al_yGa_{1-y}N$ having a thickness of $t_y$. In such embodiments, the values of x, y and the thicknesses $t_{GaN}$ and $t_y$ may satisfy the equation for linear weighting of strains:

$$x \cong \frac{yt_y}{t_y + t_{GaN}} = \frac{y}{1 + \frac{t_{GaN}}{t_y}}; \text{ or}$$

for weighting of the squares of strains:

$$x \cong \frac{y}{1+\sqrt{\frac{t_{GaN}}{t_y}}}.$$

Thus, for example, in such embodiments, if the barrier layer 20 and the channel layer 18 have the same thickness then x may be about ½y.

For example, two SiC wafers were used to grow two different bottom layers, one of the present invention containing an $Al_xGa_{1-x}N$ layer (x~0.1-0.2) and the other using a conventional GaN layer. Upon both of these layers a GaN layer was deposited followed by a high aluminum $Al_xGa_{1-x}N$ layer (x>0.4) with a thickness of 25 nm. For the layers grown on GaN layers, the AlGaN was cracked with a crack spacing on the order of only ~1 μm preventing any measurement of sheet resistivity. For the layers grown on AlGaN, the AlGaN layer was not cracked, and the sheet resistivity was only 300 Φ/i. This illustrates that the tensile stress in the top AlGaN layer can be effectively reduced to prevent cracking.

Figure 3:
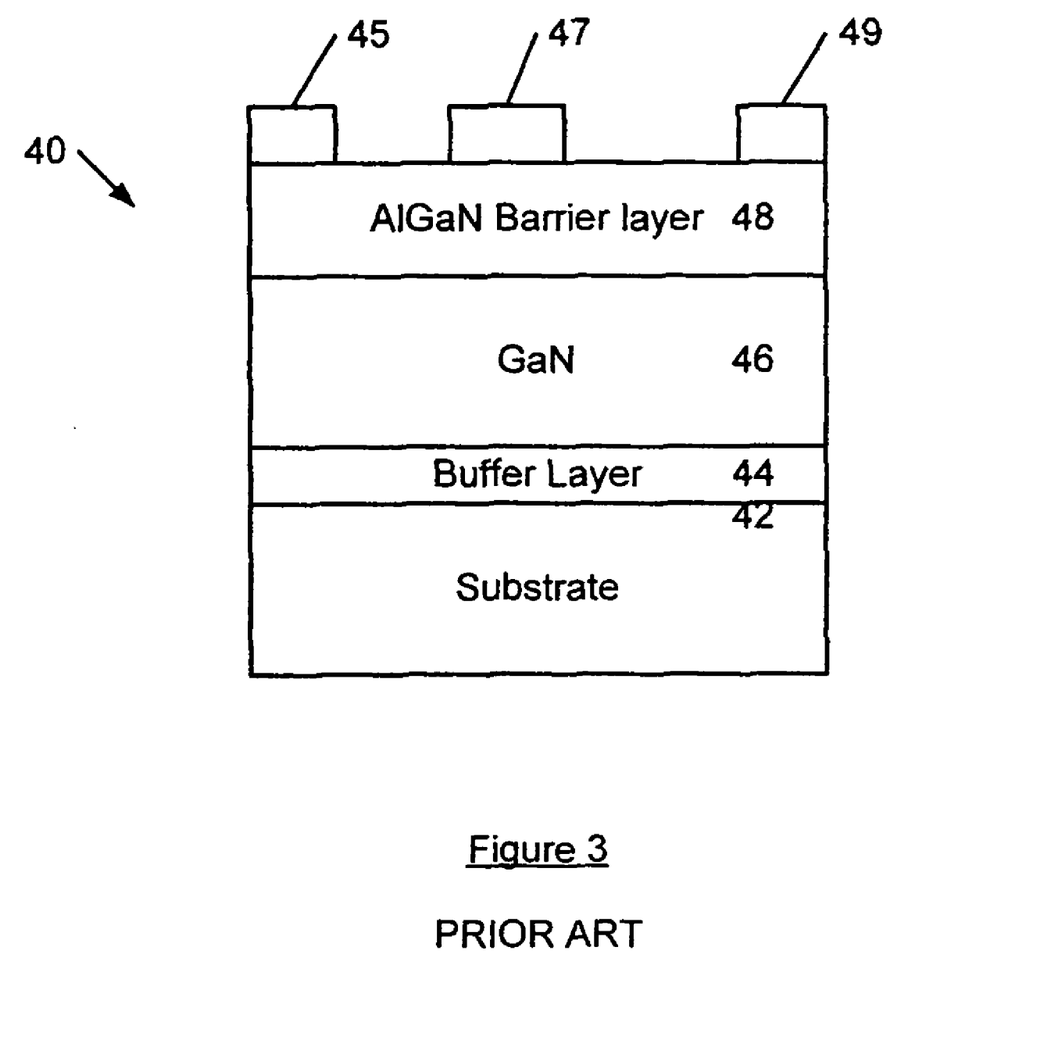
FIG. 3 is a diagram of a prior art HEMT structure.

In contrast to certain embodiments of the present invention, prior art HEMT structures incorporate a thick relaxed GaN layer as the bottom layer of the device, which then acts as the lattice template for the remaining layers of the device. In such devices, growing a thick, high aluminum percentage AlGaN barrier layer tends to impart too much strain energy to the structure, which can ultimately cause unwanted cracking to occur. An example of a prior art HEMT structure 40 is illustrated in FIG. 3. HEMT structure 40 includes a substrate 42, a buffer layer 44, a GaN channel layer 46 and an AlGaN barrier layer 48 to which source, drain and gate contacts are made. Because the GaN channel layer 46 serves as the lattice template, the AlGaN barrier layer 48 is tensile strained. As the AlGaN barrier layer 48 is made thicker or the aluminum percentage is increased, the strain energy imparted to the device by the AlGaN barrier layer 48 tends to increase, which can cause cracking as discussed above. Therefore, the thickness of the AlGaN barrier layer 48 may be limited, which in turn limits the achievable carrier density in the channel of the transistor 40.

Returning to the discussion of the transistor 10 of FIG. 1, through the use of strain control techniques according to some embodiments of the present invention, the transistor 10 is designed such that, as the layers of the device are being epitaxially deposited, the total strain energy in the structure at no time exceeds a critical level that would cause cracking in the crystal structure. Thus, the strain in the GaN based channel layer 18 is of opposite type to that of the strain in the AlGaN based barrier layer 20 such that the strains substantially offset each other and provide a substantially strain balanced device, thus keeping the strain below a critical threshold where damage occurs to the device. The resulting total strain energy of the device may be compressive or tensile.

In the drawings and specification, there have been disclosed typical embodiments of the invention, and, although specific terms have been employed, they have been used in a generic and descriptive sense only and not for purposes of limitation, the scope of the invention being set forth in the following claims.

That which is claimed is:

1. A method of fabricating a nitride based heterojunction transistor structure, comprising:
   providing a buffer layer on a substrate;
   providing a substantially unstrained AlGaN based layer on the buffer layer;
   providing a compressive strained GaN based layer on the substantially unstrained AlGaN based layer; and
   providing a tensile strained AlGaN based layer on the compressive strained GaN based layer.

2. The method of claim 1, wherein the step of providing a tensile strained AlGaN based layer comprises the step of providing a tensile strained AlGaN based layer having a predefined tensile strain on the compressive strained GaN based layer, the predefined tensile strain providing a tensile strain such that a total strain energy of the compressive strained GaN based layer and the tensile strained AlGaN based layer is about zero.

3. The method of claim 2, wherein the predefined tensile strain is provided by adjusting at least one of a thickness of the tensile strained AlGaN based layer, a composition of the substantially unstrained AlGaN based layer and/or an aluminum concentration in the tensile strained AlGaN based layer to provide the predefined tensile strain.

4. The method of claim 2, wherein the total strain energy comprises a linear summation of strain energies.

5. The method of claim 2, wherein the total strain energy comprises a weighted summation of strain energies.

6. The method of claim 2, wherein the total strain energy comprises a weighted sum of squares of the strain energy.

7. The method of claim 1, wherein the step of providing a substantially unstrained AlGaN based layer comprises the steps of:
   providing three dimensional islands of AlGaN based material on the substrate; and
   growing the AlGaN based material so that the AlGaN based material coalesces between the three dimensional islands to provide the substantially unstrained AlGaN based layer.

8. The method of claim 1, wherein the step of providing a substantially unstrained AlGaN based layer comprises providing a substantially unstrained short period super-lattice of AlN and GaN based layers.

9. The method of claim 1, wherein the step of providing a substantially unstrained AlGaN based layer comprises providing a substantially unstrained short period super-lattice of AlN and GaN layers.

10. The method of claim 1, wherein the step of providing a substantially unstrained AlGaN based layer comprises providing a substantially unstrained AlInGaN layer.

11. The method of claim 1, further comprising the step of providing a tensile strained AlN layer on the GaN based layer and disposed between the GaN based layer and the tensile strained AlGaN based layer.

12. The method of claim 1, wherein the step of providing a tensile strained AlGaN based layer comprises providing a tensile strained AlGaN layer.

13. The method of claim 1, wherein the step of providing a tensile strained AlGaN based layer comprises providing a tensile strained AlInGaN layer.

14. The method of claim 1, wherein the step of providing a tensile strained AlGaN based layer comprises providing a tensile strained AlGaN based layer having a thickness of at least 10 nm.

15. The method of claim 1, wherein the step of providing a compressive strained GaN based layer comprises providing a compressive strained GaN based layer having a thickness of from about 30 Å to about 300 Å.

16. The method of claim 1, wherein the step of providing a compressive strained GaN based layer comprises providing a compressive strained GaN based layer having a thickness of greater than about 500 Å.

17. The method of claim 1, wherein the step of providing a substantially unstrained AlGaN based layer comprises providing a substantially unstrained AlGaN based layer having a first aluminum concentration and the step of providing a tensile strained AlGaN based layer comprises providing a tensile strained AlGaN based layer having a second aluminum concentration different from the first aluminum concentration.

18. The method of claim 17, wherein the second aluminum concentration is greater than the first aluminum concentration.

19. The method of claim 1, wherein the step of providing a tensile strained AlGaN based layer comprises providing a tensile strained AlGaN based layer having a thickness and aluminum concentration large enough to induce formation of a 2D electron gas at the interface with the compressive strained GaN based layer, but less than a thickness at which cracking or defect formation occurs.

20. A method of fabricating a nitride based heterojunction transistor, comprising:
provid­ing an n-type AlGaN based bottom confinement layer having a first strain associated therewith on a substrate;
providing an n-type GaN based channel layer on the bottom confinement layer, wherein the GaN based channel layer is formed to a thickness of from about 30 Å to about 300 Å and has a second strain associated therewith, the second strain having a magnitude that is greater than a magnitude of the first strain; and
providing an n-type or undoped AlGaN based barrier layer on the channel layer, the barrier layer having a higher concentration of aluminum than the bottom confinement layer, wherein a two dimensional electron gas is formed at an interface between the barrier layer and the channel layer and wherein the AlGaN based barrier layer has a third strain associated therewith, the third strain being of opposite strain type to the second strain.

21. The method of claim 20, wherein the barrier layer is formed to a thickness of at least about 10 nm.

22. The method of claim 20, wherein the step of providing an AlGaN based bottom confinement layer comprises providing an AlGaN based bottom confinement layer on a silicon carbide substrate.

23. The method of claim 22, further comprising providing an AlN buffer layer on the silicon carbide substrate and wherein the step of providing an AlGaN based bottom confinement layer comprises providing an AlGaN based bottom confinement layer on the buffer layer.

24. The method of claim 20, wherein the step of providing an AlGaN based bottom confinement layer comprises providing a graded AlGaN based layer.

25. The method of claim 20 further comprising providing a GaN based contact layer on the barrier layer.

26. The method of claim 20, wherein the bottom confinement layer has an aluminum concentration of greater than about 10%.

27. The method of claim 20, wherein the barrier layer has an aluminum concentration of greater than about 20%.

28. The method of claim 20, further comprising the step of providing an AlN layer on the GaN based layer and disposed between the GaN based channel layer and the AlGaN based barrier layer.

29. A method of fabricating a Group III-nitride based heterojunction transistor structure, comprising:
providing a buffer layer on a substrate;
providing a first Group III-nitride based layer on the buffer layer, the first Group III-nitride based layer having a first strain associated therewith;
providing a second Group III-nitride based layer on the first Group III-nitride based layer, the second Group III-nitride based layer having a bandgap that is less than a bandgap of the first Group III-nitride based layer and having a second strain associated therewith, the second strain having a magnitude that is greater than a magnitude of the first strain; and
providing a third Group III-nitride based layer on the second Group III-nitride based layer opposite the first Group III-nitride based layer, the third Group III-nitride based layer having a bandgap that is greater than the bandgap of the second Group III-nitride based layer and having a third strain associated therewith, the third strain being of opposite strain type to the second strain.

30. The method of claim 29, wherein the step of providing a first Group III-nitride based layer comprises providing an $Al_xGa_{1-x}N$ layer, where $0<x<1$.

31. The method of claim 29, wherein the step of providing a second Group III-nitride based layer comprises providing a GaN layer.

32. The method of claim 30, wherein the step of providing a third Group III-nitride based layer comprises providing an AlN layer.

* * * * *

UNITED STATES PATENT AND TRADEMARK OFFICE
CERTIFICATE OF CORRECTION

PATENT NO. : 8,153,515 B2  Page 1 of 1
APPLICATION NO. : 11/325735
DATED : April 10, 2012
INVENTOR(S) : Saxler It is certified that error appears in the above-identified patent and that said Letters Patent is hereby corrected as shown below:

In the Patent:
Column 11, Line 19: Please replace "only 300 Φ/i." to read -- only 300 Ω/□. --

Signed and Sealed this
Eighteenth Day of September, 2012

David J. Kappos
*Director of the United States Patent and Trademark Office*